(12) United States Patent
Chen et al.

(10) Patent No.: US 8,716,831 B2
(45) Date of Patent: May 6, 2014

(54) ONE TIME PROGRAMMABLE STRUCTURE USING A GATE LAST HIGH-K METAL GATE PROCESS

(75) Inventors: Xiangdong Chen, Irvine, CA (US); Wei Xia, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/249,022

(22) Filed: Sep. 29, 2011

(65) Prior Publication Data

US 2013/0082347 A1    Apr. 4, 2013

(51) Int. Cl.
*H01L 23/525* (2006.01)

(52) U.S. Cl.
USPC .......... 257/529; 257/209; 257/379; 257/380; 257/E23.149

(58) Field of Classification Search
USPC .......... 257/529, 379, 329, 209, 211, E23.146, 257/E23.149, 380
See application file for complete search history.

(56) References Cited

U.S. PATENT DOCUMENTS

2011/0057267 A1*   3/2011   Chuang et al. ............ 257/380

* cited by examiner

*Primary Examiner* — Thanh Nguyen
(74) *Attorney, Agent, or Firm* — Sterne, Kessler, Goldstein & Fox P.L.L.C.

(57) ABSTRACT

An eFuse structure having a first metal layer serving as a fuse with a gate including an undoped polysilicon (poly), a second metal layer and a high-K dielectric layer all formed on a silicon substrate with a Shallow Trench Isolation formation, and a process of fabricating same are provided. The eFuse structure enables use of low amounts of current to blow a fuse thus allowing the use of a smaller MOSFET.

18 Claims, 14 Drawing Sheets

ONE TIME PROGRAMMABLE STRUCTURE USING A GATE LAST HIGH-K METAL GATE PROCESS

BACKGROUND

1. Field of Invention

The present invention relates generally to one time programmable (OTP) memory, and more particularly to OTP memory that is fabricated using a Gate-Last High-K Metal Gate fabrication process.

2. Background Art

In the field of data storage, there are two general types of storage devices. The first type of storage device is volatile memory. Volatile memory loses stored information when power is removed from the volatile memory circuit. The second type of storage device is non-volatile memory. Non-volatile memory retains stored information even after power is removed from the non-volatile memory circuit. Some non-volatile memory designs permit reprogramming while other designs only permit one-time programming.

One time programmable (OTP) memory represents a type of non-volatile memory that may be programmed once, typically, by permanently programming a fuse to open a connection or by permanently programming an anti-fuse to close a connection.

Currently, the following kinds of fuses are utilized as eFuses: gate oxide breakdown, hot carrier, silicide fuse, interconnect metal fuse. The HKMG process allows for a high-K dielectric to replace the silicon dioxide gate dielectric that was used in previous generations of foundry technology. The use of the high-K dielectric allows for further miniaturization of micro-electrical components. Furthermore, the previous generations of fuses require a high amount of current in order of hundreds of microamps to blow.

Accordingly, what is needed is an eFuse that is compatible with a HKMG process that is conventionally utilized in 28 nm foundry technology. Additionally, it would be beneficial if the eFuse can be utilized by application of a low current level as compared to conventional eFuses.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
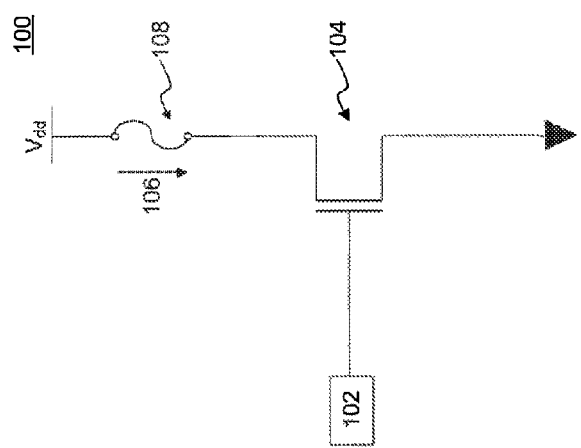
FIG. 1 illustrates a layout of a conventional OTP circuit.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described. Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner.

The exemplary embodiments described herein are provided for illustrative purposes, and are not limiting. Other exemplary embodiments are possible, and modifications may be made to the exemplary embodiments within the spirit and scope of the present invention. Therefore, the Detailed Description is not meant to limit the present invention. Rather, the scope of the present invention is defined only in accordance with the following claims and their equivalents.

The following Detailed Description of the exemplary embodiments will so fully reveal the general nature of the present invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

The example embodiments described herein are provided for illustrative purposes, and are not limiting. Further structural and operational embodiments, including modifications/alterations, will become apparent to persons skilled in the relevant art(s) from the teachings herein.

Conventional eFuse

FIG. 1 illustrates a layout of a conventional OTP circuit 100. The OTP circuit 100 contains a decoder 102 which provides a voltage to a gate of a MOSFET 104. Additionally, a voltage Vdd is applied to an anode of the eFuse 108, and a cathode of the eFuse 108 is coupled to the MOSFET 104. (Herein eFuse is to be interpreted as a semiconductor fuse element, that can be used to support an OTP for example)

Based on the voltage applied to the gate of the MOSFET 104, a current 106 is allowed to flow, leading to a blowout in a conventional eFuse 108. The blowout occurs because the eFuse 108 portion is too narrow to carry the current, causing thermal destruction of the semiconductor material that makes up the eFuse portion.

Figure 2A:
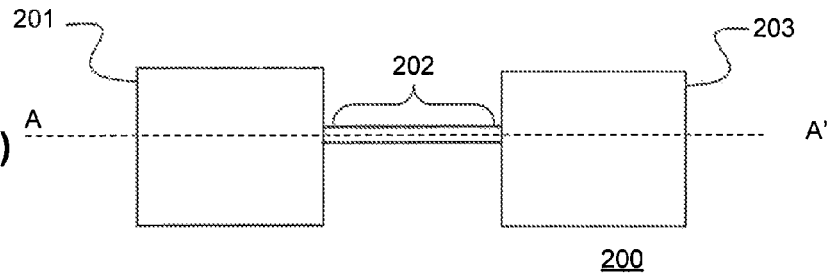
FIGS. 2a-2c illustrate a top-view and cross-sectional diagrams of a known eFuse structure.

FIG. 2a illustrates a top-view diagram of a conventional eFuse 200 with silicide used as blowout element. It includes an anode 201 connected via a fuse neck 202 with a cathode 203. In an embodiment, the eFuse 200 may be functionally similar to the eFuse 108.

Figure 2B:
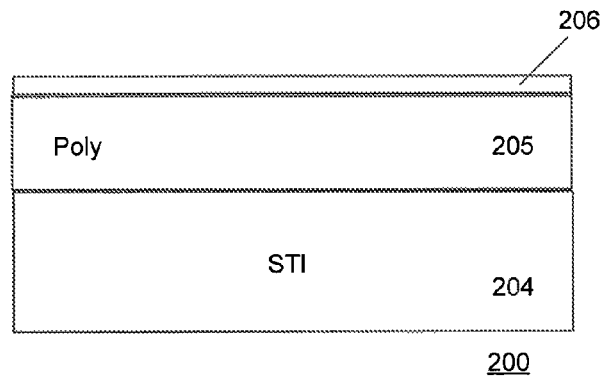

FIG. 2b illustrates a cross-sectional diagram of the conventional awe 200 before any programming occurs. It includes a shallow trench isolation (STI) formation 204, with a layer of polysilicon (poly) 205 above the STI formation 204. A top silicide layer 206 is above the poly layer 205, where the poly silicon 205 carries any current during programming, and destructs if programmed to do so, creating an open circuit as shown in FIG. 2c.

Figure 2C:
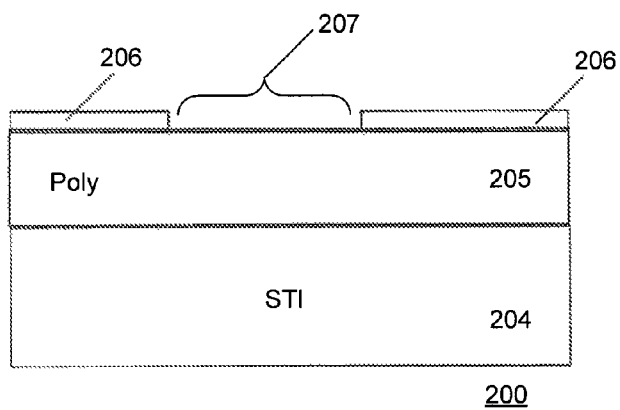

FIG. 2c illustrates a cross-sectional diagram of the conventional eFuse 200 after the programming occurs. Due to the application of the programming there is a blow out in a blowout region 207 of the silicide layer 206. The programming would lead a bit to read "0" as opposed to reading a "1" as it would in the pre-programming state presented in FIG. 2b.

This eFuse 200 is not compatible with a gate-last HKMG process. A gate-last HKMG process entails a process in which a layer of high-K dielectric is utilized for the gate structure. Additionally, in the process of manufacture, the deposition of a gate metal is the last step that is conducted, and replaces the silicide layer 206. The eFuse 200 is not compatible with a gate-last HKMG process, as it does not contain a high-K dielectric and utilizes a silicide layer on top.

Details of the Present Invention

Figure 3:
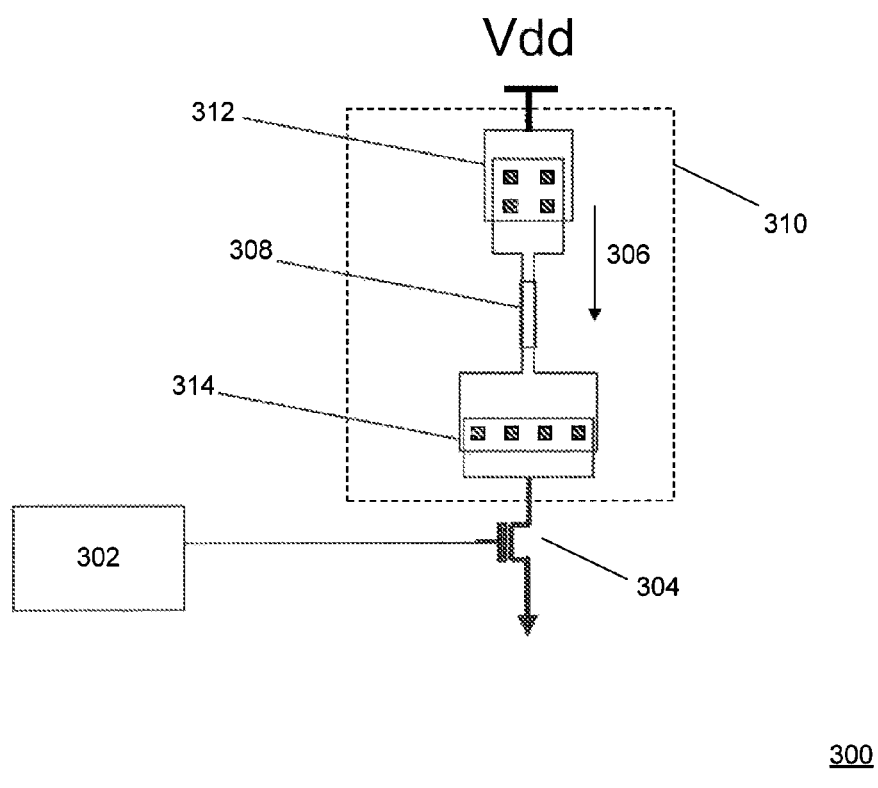
FIG. 3 illustrates a layout of an OTP circuit according to an exemplary embodiment of the present invention.

FIG. 3 illustrates a layout of an OTP circuit 300 according to an exemplary embodiment of the present invention. An OTP circuit 300 contains a decoder 302 which provides a voltage to a gate of a MOSFET 304. Additionally, a voltage Vdd is applied to the anode 312, and cathode 314 is coupled to the drain of the MOSFET 304. Based on the voltage applied to a gate of the MOSFET 304, current 306 is allowed to flow, leading to the blow out in the fuse neck region 308 of an eFuse 310. Specifically, when the MOSFET 304 conducts, then the cathode 314 is grounded causing current 306 to flow through the fuse neck region 308. As there is no resistance in the current path (other than conductor resistance), the fuse neck region will thermally destruct, creating an open circuit.

Figure 4A:
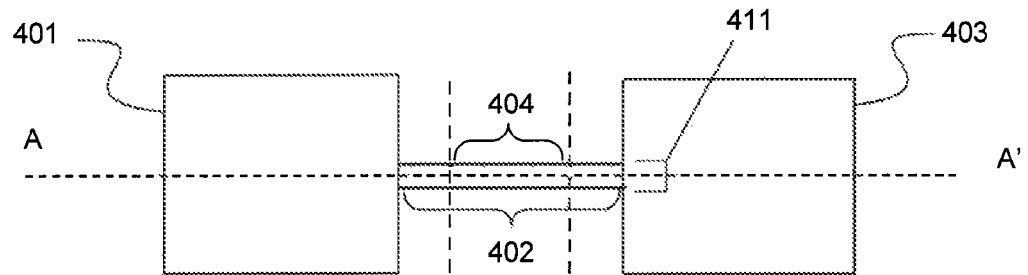
FIGS. 4a-4c illustrate a top-view and cross-sectional diagrams of an eFuse structure according to an exemplary embodiment of the present invention.

FIG. 4a illustrates a top-view diagram of an eFuse 400 according to an exemplary embodiment of the present invention. It includes an anode 401 connected via a fuse neck 402 with a cathode 403. Region 404 of the fuse neck 402 contains undoped poly silicon, which has a relative high resistivity compared to semiconductor metal layers.

Figure 4B:
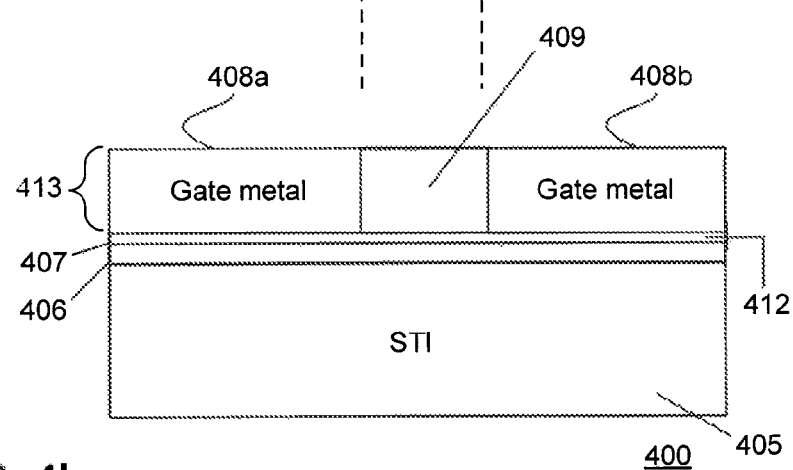

FIG. 4b illustrates a cross-sectional diagram of the eFuse 400 before any programming occurs. It includes a STI formation 405, with a layer of high-K dielectric 406 disposed above the STI formation 405. A first gate metal layer 407 is disposed above the layer of high-K dielectric 406. A second gate metal layer 408 is disposed above the first gate metal layer 407, where the second gate metal layer 408 has a first portion 408a and a second portion 408b, with an undoped poly formation 409 in-between the first portion 408a and the second portion 408b. The undoped poly formation 409 extends in a horizontal direction the same length as region 404 discussed above, as shown in the drawing such that the undoped poly formation 409 is formed in a portion but not all of the fuse neck 402. For example, as illustrated in FIG. 4b, the first portion 408a and second portion 408b of the second gate metal layer 408 are disposed on respective portions of the first metal layer 407 within the fuse neck 402. Here, the first metal layer 407 within the fuse neck 402 includes a first portion having a part of the first portion 408a disposed thereon, a second portion having the updoped poly formation 409 disposed thereon, and a third portion having a part of the second portion 408b disposed thereon, where the second portion of the first metal layer 407 within the fuse neck 402 is disposed between the first and third portions of the first metal layer 407 within the fuse neck 407. Before programming, the gate metal layer 407 is laterally continuous and has low resistance between the anode 401 and cathode 403. The undoped poly formation 409 provides high resistance and sits on top of the gate metal layer 407, and separates the first and second portions of the second gate metal layer 408.

In an embodiment, the anode 401, fuse neck 402, and cathode 403 may be functionally similar to the anode 312, cathode 314 and the fuse neck region 308 respectively.

Figure 4C:
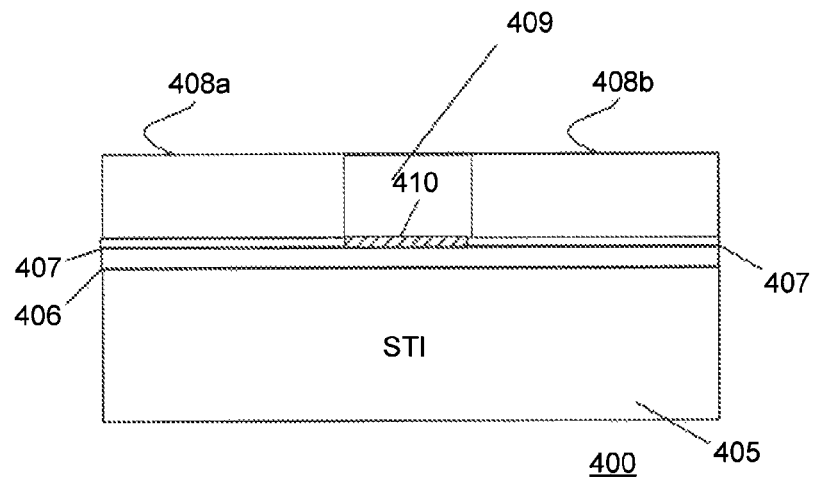

FIG. 4c illustrates a cross-sectional diagram of the eFuse 200 according to an exemplary embodiment of the present invention after the programming occurs. Due to the application of the programming there is a blow out in a blowout region 410 of the gate metal layer 407. After the gate metal layer 407 has a blowout in the blowout region 410, there is high resistance between the anode 401 and cathode 403 because the only signal path is provided through the undoped poly formation 409, which has high resistance relative to the continuous metal layer 407.

In an exemplary embodiment of the present invention, a width 411 of the neck fuse 404 (e.g. gate metal layer 407) may be 20-50 nm. Additionally, the gate metal layer 407 serving as the fuse may have a thickness 412 of 5-30 nm. Whereas, the second gate metal layer 408 may have a thickness 413 of 30-70 nm. Accordingly, the second gate metal layer 408 may be moderately to substantially thicker than the first gate metal layer 407.

The advantage of this OTP structure is that it is fully compatible with a 28 nm gate last high-K metal gate process, without the need for additional processes or masks. Additionally, since a gate metal is used as the fuse material, the thickness can be reduced to a relatively small size (5-30 nm), which requires a smaller current to blow the fuse than conventional silicide. For example, in an exemplary embodiment the current can be in the order of micro-amps instead of hundreds of micro-amps as utilized in the conventional art where silicide is the fuse material. Additionally, due to the small amount of current that is required to blow the fuse the size of the blow MOSFET 304 can also be extremely small. As will be apparent, the eFuse structure 400 can be fabricated in the same process run as main-line FETs in IC fabrication.

Method of Fabrication

Figure 5:
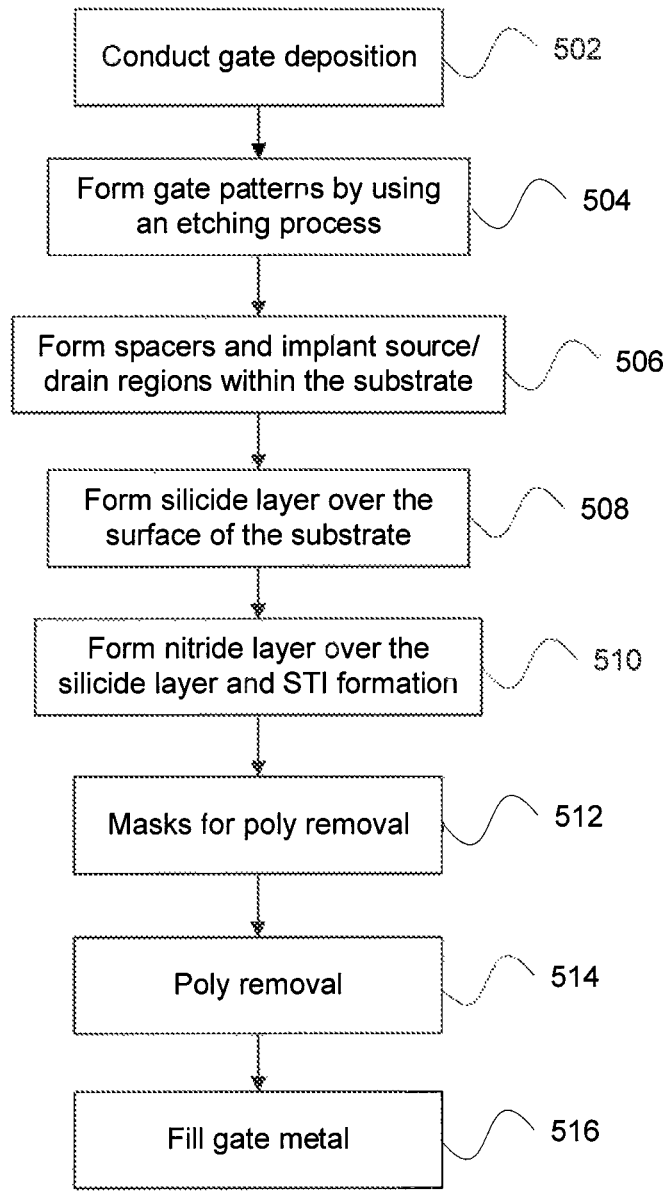
FIG. 5 illustrates a flowchart providing example steps for manufacturing an IC device, according to an embodiment of the present invention.

FIG. 5 illustrates a flowchart 500 providing example steps for manufacturing an IC device having an Efuse such as Efuse 400, according to an exemplary embodiment of the present invention. Other structural and operational embodiments will be apparent to persons skilled in the relevant art(s) based on the following discussion. The steps shown in FIG. 5 do not necessarily have to occur in the order shown. The steps of FIG. 5 are described in detail below in conjunction with the semiconductor layers that are shown in FIGS. 6A-6H.

Figure 6A:
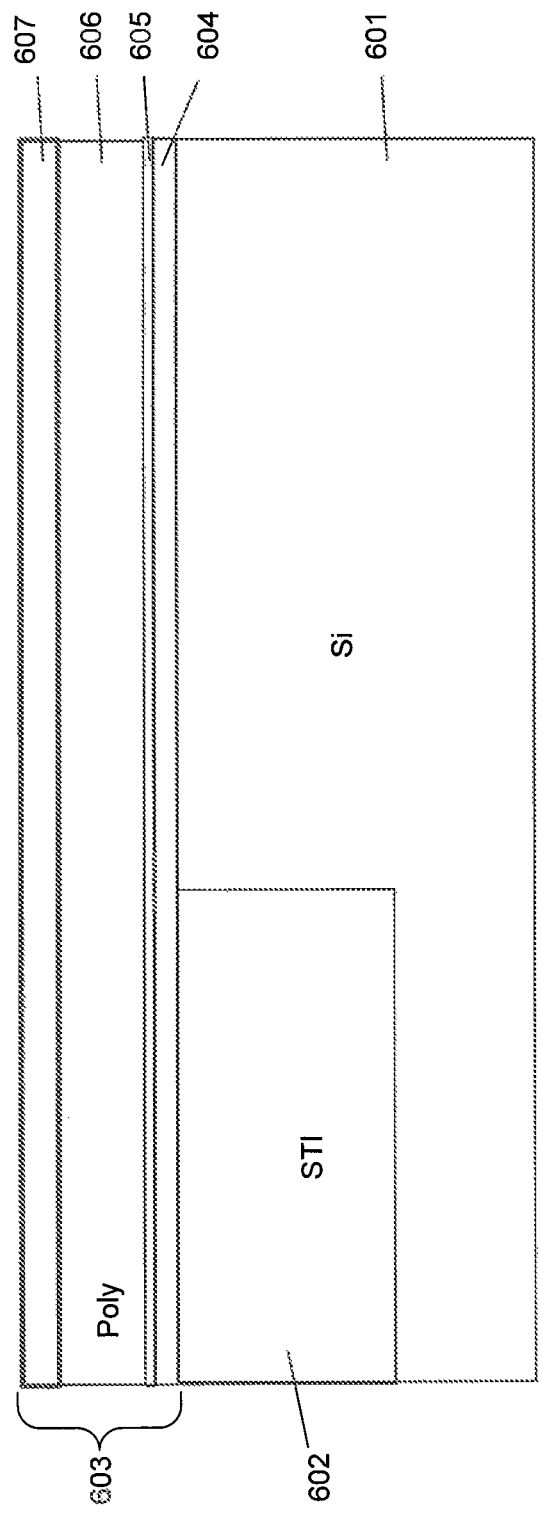
FIGS. 6a-6h illustrate the products of the example steps that are being processed in the flowchart of FIG. 5, according to an exemplary embodiment of the present invention.

In step 502, gate deposition is conducted, thus a plurality of types of layers including a high-K dielectric layer, a metal layer, a poly layer and a nitride layer are deposited over a silicon substrate with a STI formation. For example, FIG. 6a illustrates a silicon (Si) substrate 601 having a STI formation 602. Above the substrate 601, a dummy layer 603 is formed.

The dummy layer 603 may include a high-K dielectric layer 604, a metal layer 605, an undoped poly silicon layer (herein "poly") 606, and a nitride layer 607.

Figure 6B:
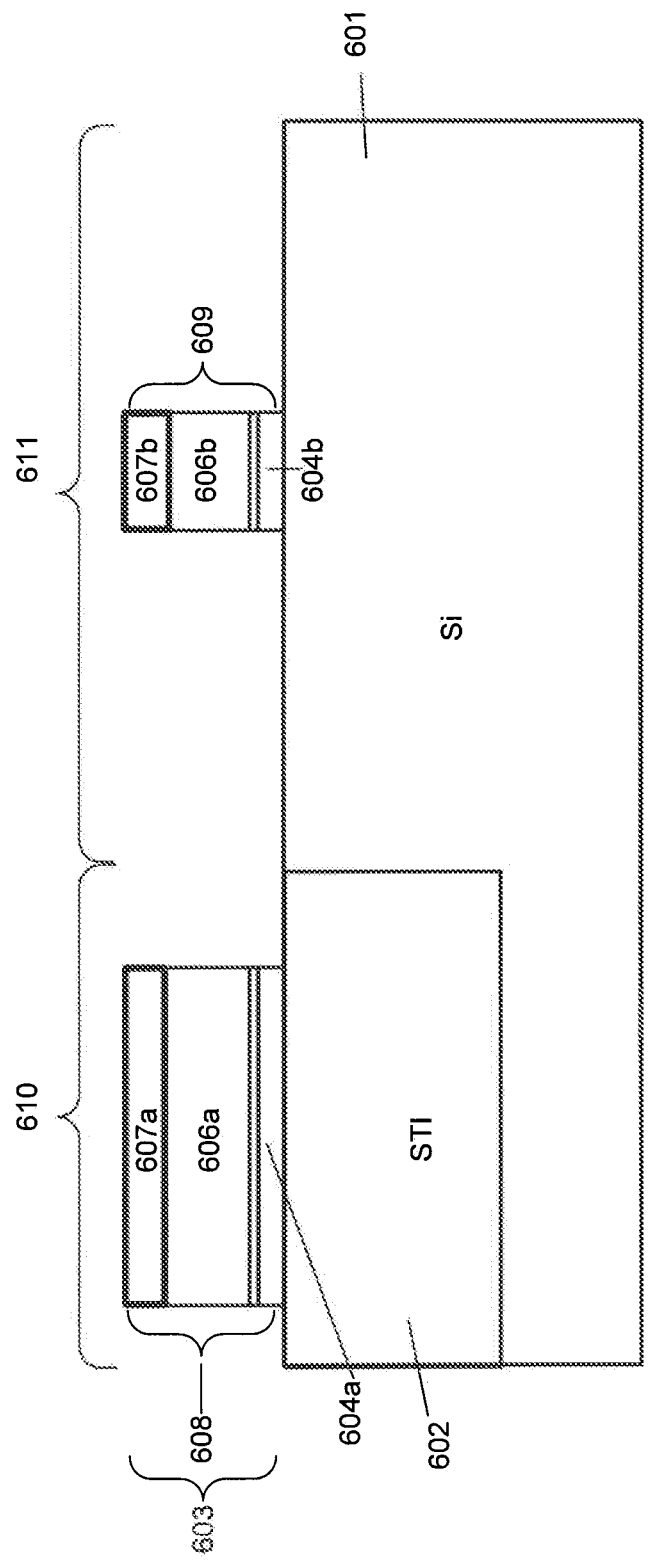

In step 504, gate patterns are formed by utilizing an etching process. In an embodiment, parts of all layers above a silicon substrate with an STI formation are etched away. In an exemplary embodiment, gate patterning is done using an etching process, such as, dry etching, wet etching, or plasma etching. Furthermore, a masking process can also be used to form gate patterns. For example, FIG. 6b illustrates a formed gate pattern by etching away parts of the dummy layer 603. An eFuse gate 608 is formed in the eFuse region 610 and a transistor gate 609 is formed in the transistor region 611.

The eFuse gate 608 and transistor gate 609 retain the composition of the dummy layer 603. By way of example, the eFuse gate 608 and transistor gate 609 may include a high-K dielectric layer 604, a metal layer 605, a Poly layer 606, and a nitride layer 607. As shown, the designation "a" and "b" are used to identify remnant portions of the same respective layers in the eFuse region 610 and transistor region 611. For example, eFuse gate 608 has high-K dielectric layer portion 604a, and transistor gate 609 has a high-K dielectric layer portion 604b.

Figure 6C:
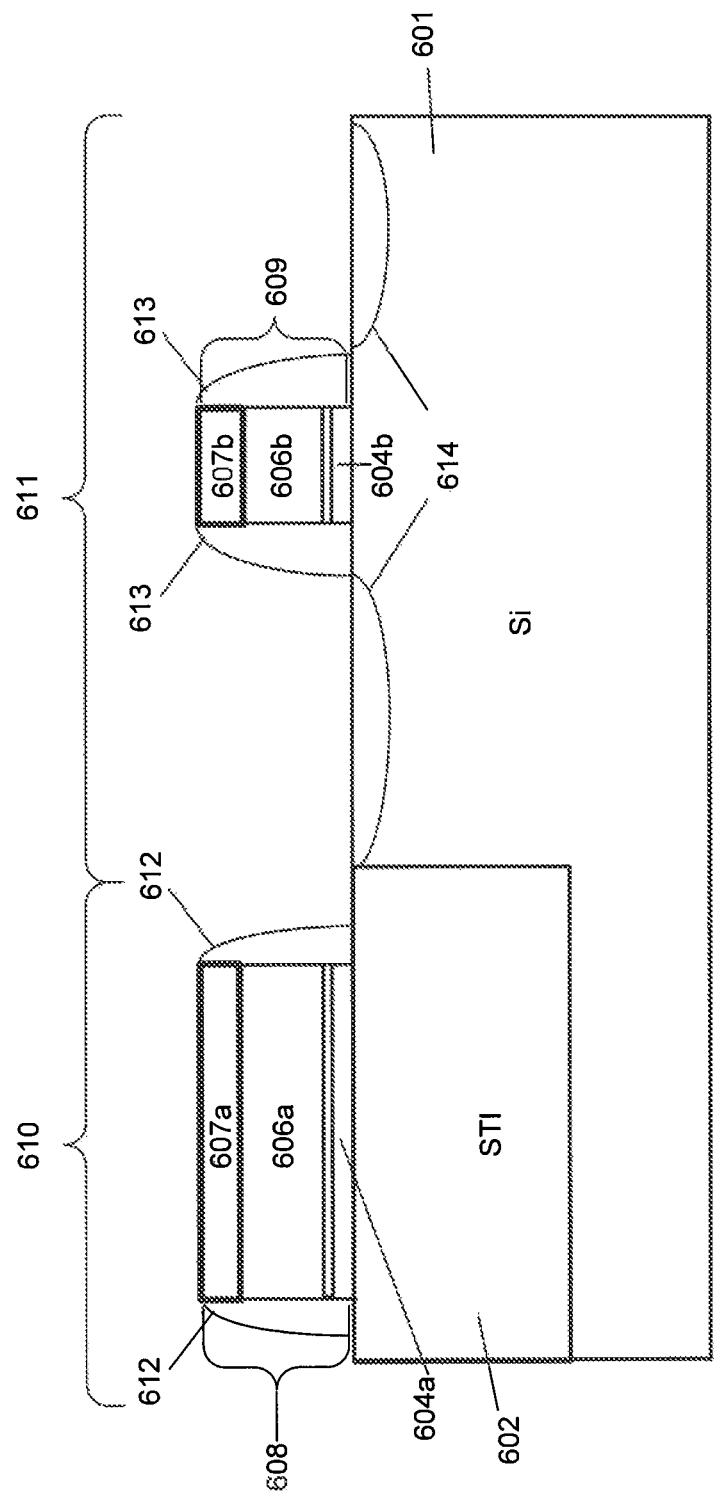

In step 506, spacers are formed around the respective gates and source/drain regions are implanted within the silicon substrate. For example, FIG. 6c illustrates a first spacer 612 and a second spacer 613 on the substrate 601. In an embodiment, first spacers 612 is vertically attached to both sidewalls of eFuse gate 608, and second spacers 613 is vertically attached to both sidewalls of transistor gate 609. By way of example, first spacer 612 and second spacer 613 can be formed of silicon dioxide, silicon nitride, silicon oxynitride, silicon carbide, titanium nitride, various low K dielectrics, or any combination thereof. First spacers 612 and second spacers 613 can be formed by using one of the deposition processes mentioned above and by applying an anisotropic etching technique to shape the desired spacer characteristics. Additionally, source and drain regions 614 are implanted within the substrate 601. In an embodiment, source and drain regions 614 can use the base of the second spacers 613 to define an area of substrate 601 in which dopants can be implanted.

By way of example, source and drain region 614 can be laterally implanted within substrate 601 beside each sidewall of transistor gate 609. In an embodiment, source and drain regions 614 are constructed by doping substrate 601 with impurities, such as, arsenic, phosphorus, or boron. Doping with boron adds positive charges making a p-type region, while doping with arsenic or phosphorus adds electrons making an n-type region. Other impurities can also be used to achieve the preferred configurations. Source and drain regions 614 can be formed by using processes such as, ion implantation, diffusion, and photolithography.

Figure 6D:
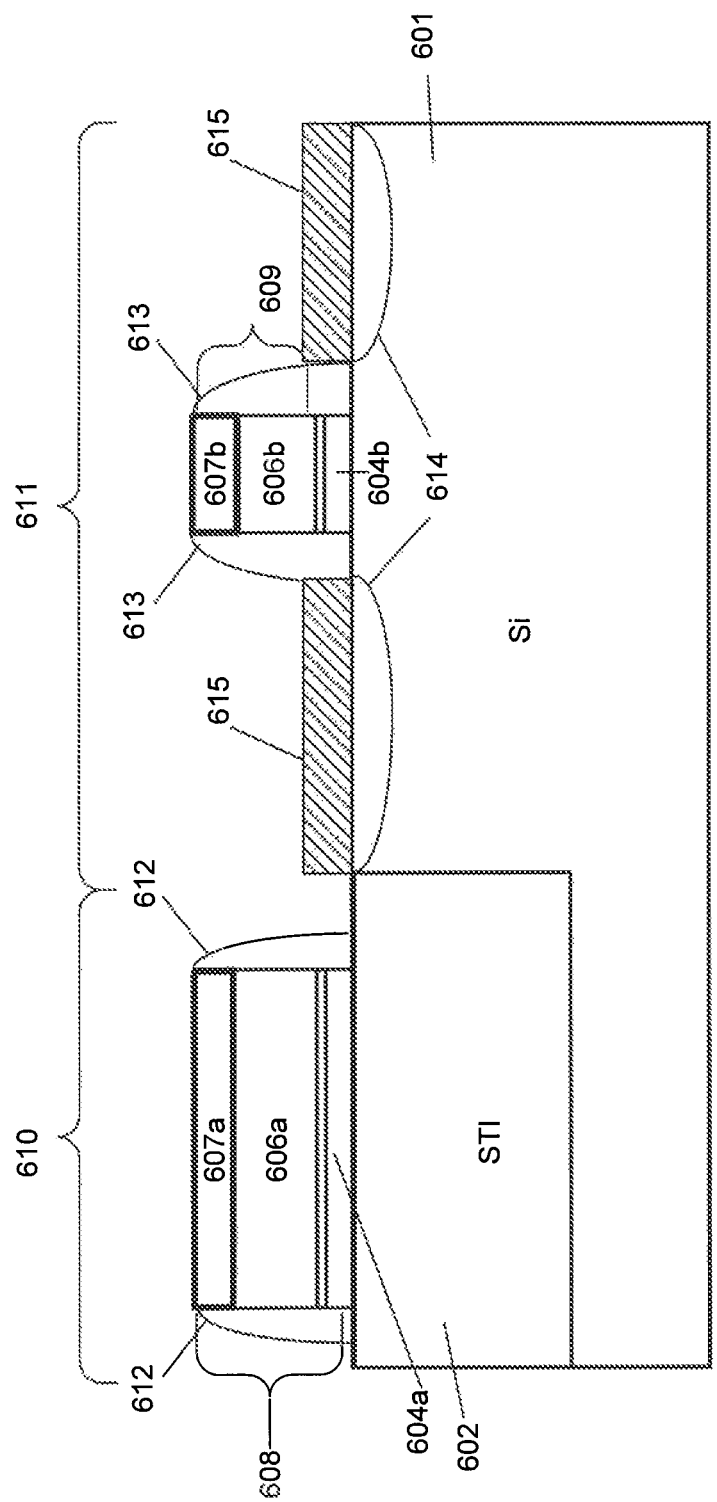

In step 508, a silicide layer is formed over the surface of the substrate. For example, FIG. 6d illustrates a silicide layer 615 formed over portions of the surface of substrate 601. In particular, silicide layer 615 is formed on top of the source and drain regions 614 that are implanted within substrate 601. By way of example, silicide layer 615 can be used as an electrical contact for the source and drain regions 614.

Figure 6E:
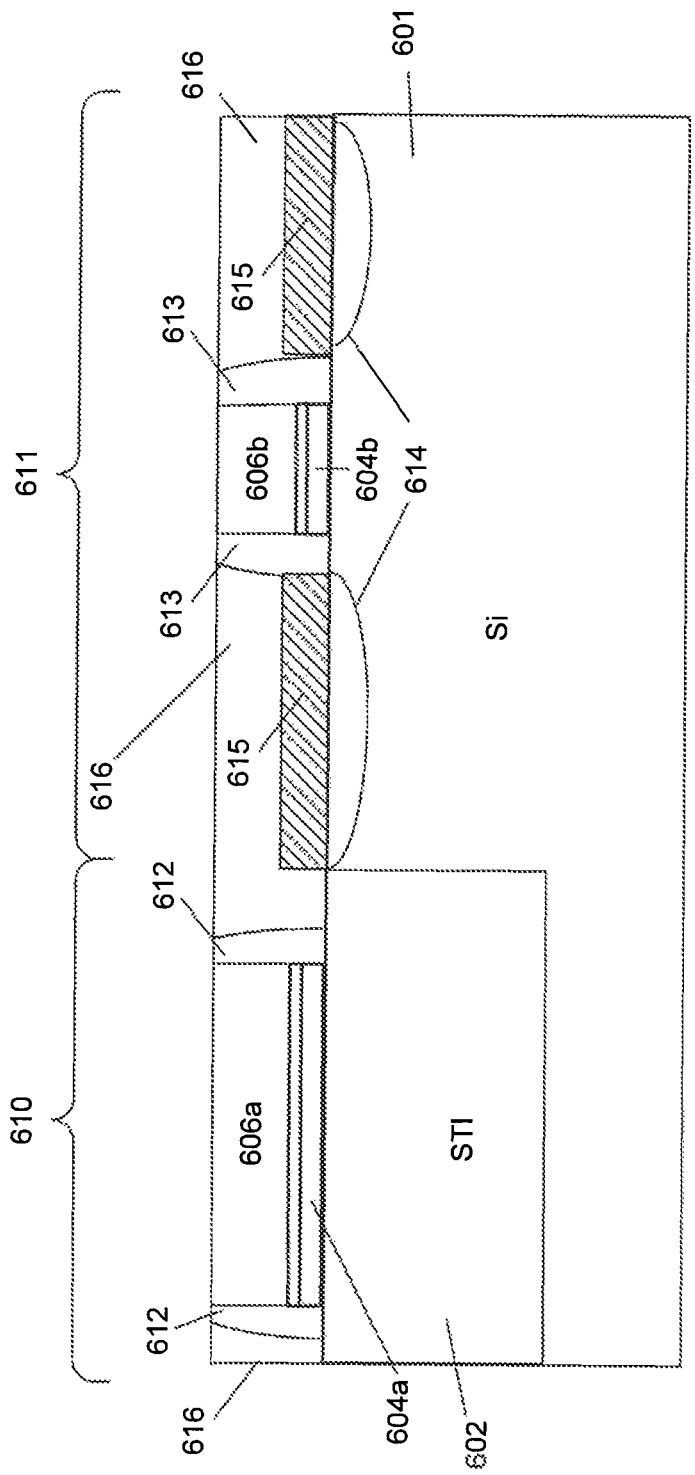

In step 510, a nitride layer is formed over the silicide layer and the STI formation. For example, FIG. 6e illustrates a nitride layer 616 formed over STI formation 602 and silicide layer 615. Nitride layer 616 can be formed by using a variety of deposition techniques mentioned above. Nitride layer 616 insulates eFuse region 610 and transistor region 611. For example, nitride layer 616 is deposited over silicide layer 615 and STI formation 602 so as to encase eFuse gate 608 and transistor gate 609. The top surface of nitride layer 616 and nitride layer 607 can be polished back using CMP to expose the poly layer 606 of the eFuse gate 608 and the transistor gate 609 for further processing as described below.

Figure 6F:
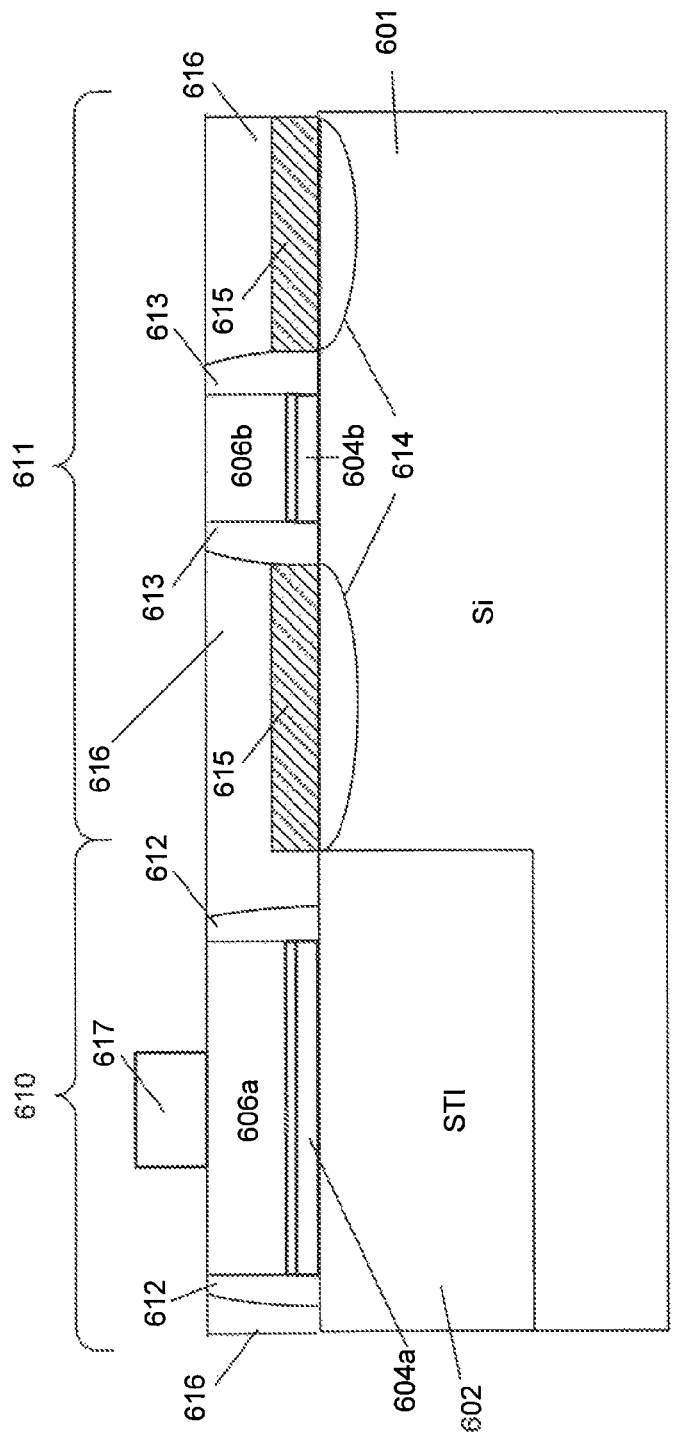

In step 512, a mask is formed over the surface of the poly layer in the eFuse region. For example, FIG. 6f illustrates a mask 617 placed above the poly layer 606a in the eFuse region 610. The mask 617 allows for poly removal by a process of etching the poly layer 606 in the eFuse region 610 and the transistor region 611. Specifically, the mask protects a portion of the poly layer 606, so that only the portions (external to the mask 617) of the poly layer 606a will be removed in the efuse region 610, but the entire poly layer 606b in the transistor region 611 will be removed.

Figure 6G:
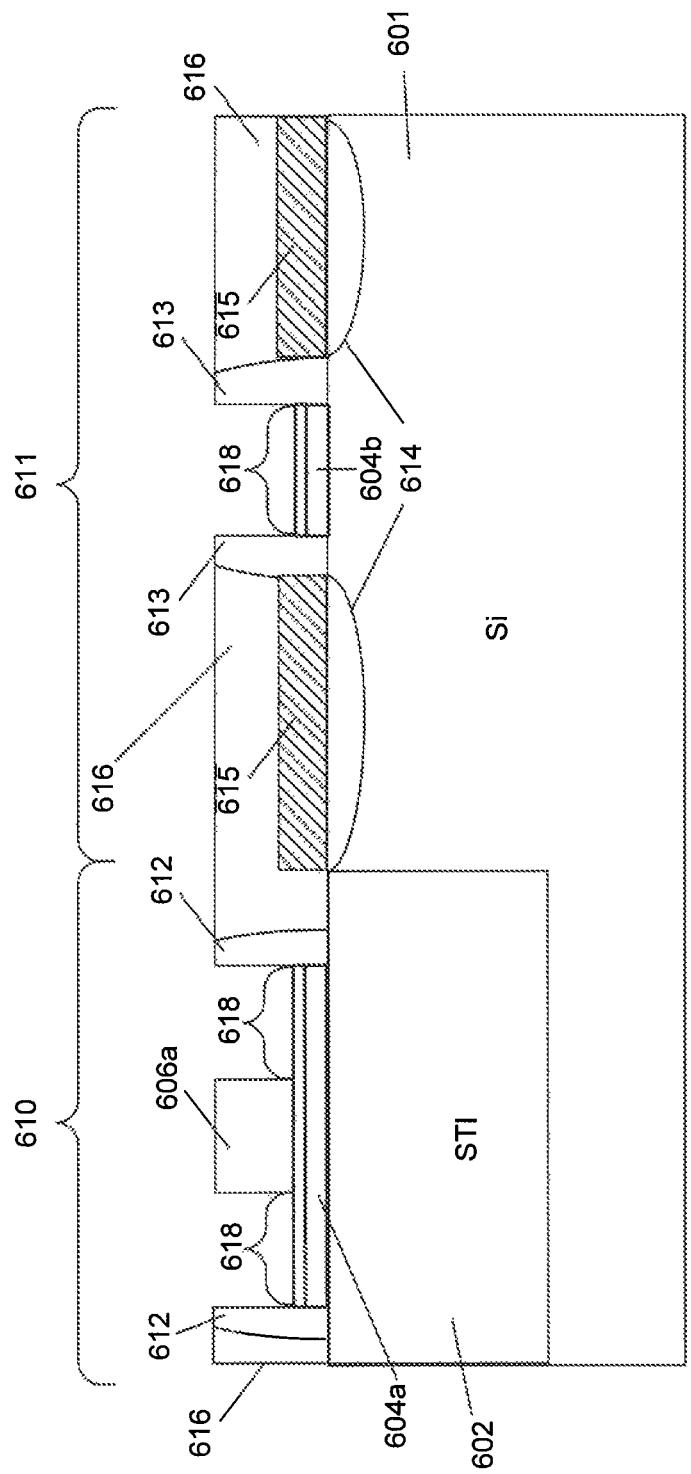

In step 514, exposed poly is removed, and then a mask is removed allowing for fillable regions to be formed. For example, FIG. 6g illustrates poly layer (or "region") 606a is still remaining with fillable regions 618 formed around the poly layer 606a in the eFuse region 610. Whereas, all of the poly layer 606b is removed from the transistor region 611. Furthermore, the mask 617 is removed from the surface of the poly layer 606 in the eFuse region 610.

Figure 6H:
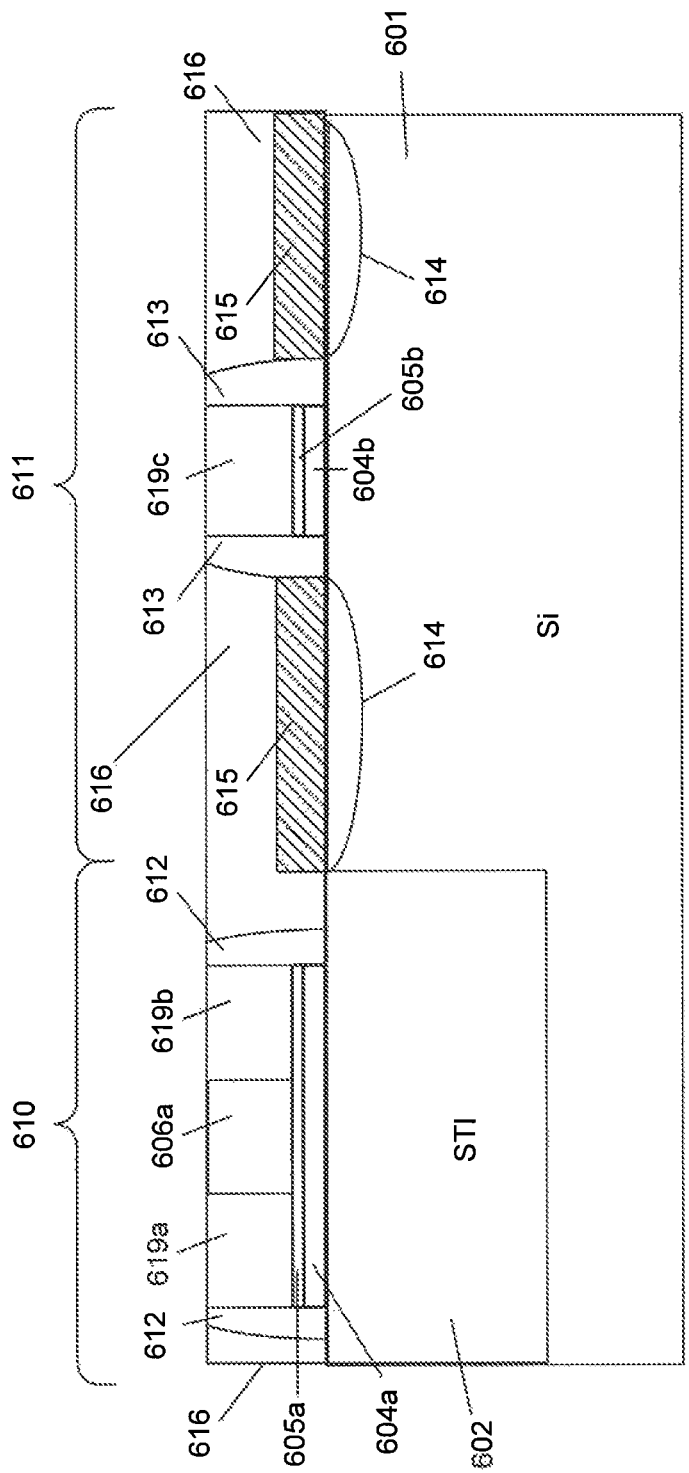

In step 516, a second gate metal is filled above any exposed parts of the gate layer. For example, FIG. 6h illustrates gate metal layer 619 formed to fill in the space of the fillable regions 618 on each side of the poly layer 606a in the eFuse region 610 and between the spacer 613 in the transistor region 611. As a result of process 500, an eFuse for an OTP is formed in e-fuse region 610 comprising high-K dielectric layer 604a, first metal layer 605a, and poly layer 606a, and a second metal layer having regions 619a,b. The first metal layer 605 and the poly layer 606a form the fuse neck region that is blown/not blown during programming, and the second metal regions 619a,b form the anode and cathode, respectively, of the EFuse for the OTP. Further, a FET transistor is formed in transistor region 611 adjacent to the e-fuse region 610. The gate of the FET includes high-K dielectric layer 604b, first metal layer 605b, and second metal layer 619c. The source and drain are formed by source and drain regions 614 with suicide contacts 615. Accordingly, the advantage of process 500 is that OTP and FET transistor devices are both fabricated in a single semiconductor process run and on the same semiconductor wafer, without any additional masking or processing steps.

According to embodiments, process 500 may be used during fabrication of an integrated circuit that can comprise static random device access memory (SRAM) and/or other logic circuits, passive components such as resistor, capacitors, and inductors, and active components such as P-channel field effect transistors (PFET), N-channel field effect transistors (NFET), metal oxide semiconductor field effect transistor (MOSFET), complementary metal oxide semiconductor field effect transistor (CMOS), bipolar transistor, high voltage transistor, and other similar devices.

In another, exemplary embodiment of the present invention, the process 500 can be followed by Back-end-of-line (BEOL) part of the fabrication state where contacts, interconnected wires, vias and dielectric structures may be formed.

Other Modifications

Figure 7A:
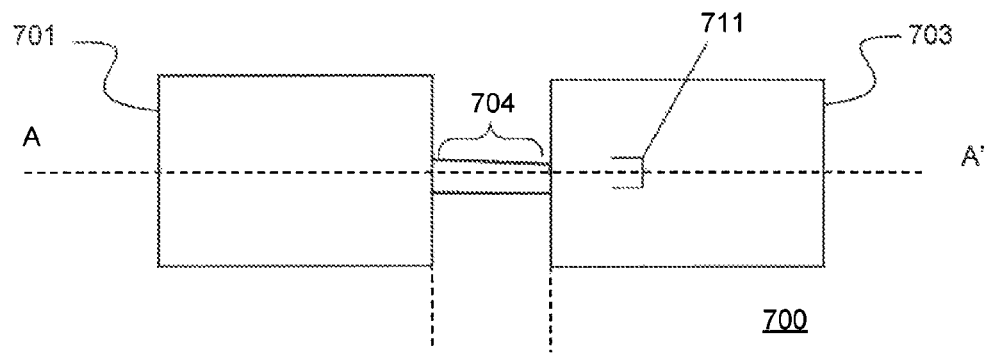
FIGS. 7a-7b illustrate a top-view and a cross-sectional diagram of another eFuse structure according to an exemplary embodiment of the present invention.

FIG. 7a illustrates a top-view diagram of an eFuse 700 according to another exemplary embodiment of the present invention. It includes an anode 701 connected via a fuse neck 704 with a cathode 703. All of the fuse neck 704 contains undoped poly.

Figure 7B:
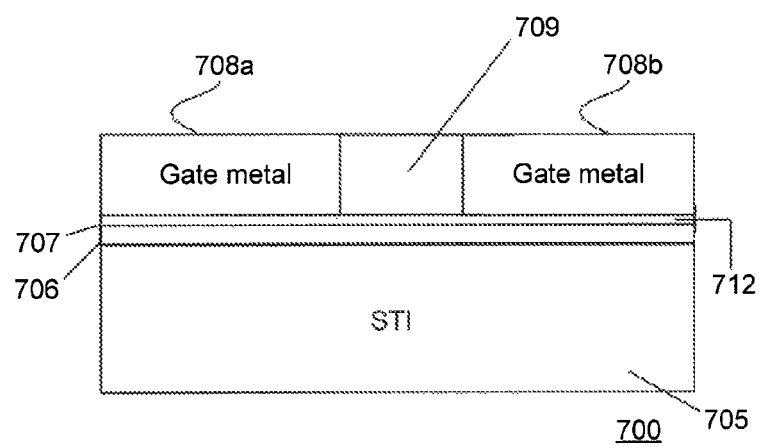

FIG. 7b illustrates a cross-sectional diagram of the eFuse 700 before any programming occurs. It includes a STI formation 705, with a layer of high-K dielectric 706 above the STI formation 705. A first gate metal layer 707 is disposed above the layer of high-K dielectric 706. Above the first gate metal layer 707 is a second gate metal region 708 with an undoped poly formation 709 in-between the second gate metal region 708a and 708b. The undoped poly formation 709 extends in a horizontal direction the same length as the fuse neck 704 discussed above.

In an embodiment, the eFuse 700 is functionally similar to eFuse 400 and is blown in a similar manner.

Additionally, in further illustrated embodiments, a fuse neck in an eFuse may not be centered, wherein the amount of gate metal on either side of a poly formation may be unequal.

CONCLUSION

The embodiments of the invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A semiconductor device having an eFuse structure for a one time programmable memory (OTP), comprising:
    a base substrate having a shallow trench isolation (STI) formation;
    a first metal layer formed on the STI formation, having a shape that defines an anode, a cathode, and a fuse neck connected between the cathode and the anode;
    an undoped polysilicon (poly) region formed on the fuse neck; and
    a second metal layer having a first portion and a second portion that are formed on the first metal layer on opposite sides of the poly region, the first portion of the second metal layer formed on the anode and on a first portion of the fuse neck, and the second portion of the second metal layer formed on the cathode and on a second portion of the fuse neck, wherein the poly region is formed on a third portion of the fuse neck disposed between the first and the second portions of the fuse neck.

2. The semiconductor device of claim 1, wherein the poly region is formed only over the fuse neck, and separates the first and the second portions of the second metal layer.

3. The semiconductor device of claim 1, wherein the poly region has a substantially higher resistance than the first metal layer and the second metal layer.

4. The semiconductor device of claim 3, wherein if a voltage is applied across the anode and cathode, then a resulting current flows primarily through the fuse neck.

5. The semiconductor device of claim 4, wherein the fuse neck is configured to fail and become substantially an open circuit in response to an increase in current through the fuse neck so as to program the OTP.

6. The semiconductor device of claim 5, wherein the current necessary to open the fuse neck is on the order of single digit micro-amps.

7. The semiconductor device of claim 1, wherein a thickness of the first metal layer is substantially less than that of the second metal layer and the poly region.

8. The semiconductor device of claim 7, wherein the thickness of the first metal layer is approximately between 5-30 nm, and the thickness of the second metal layer is approximately between 30-70 nm.

9. The semiconductor device of claim 1, wherein the second metal layer connects the eFuse structure to a blow MOSFET.

10. The semiconductor device of claim 9, wherein the blow MOSFET is configured to provide current to the eFuse to fuse the first metal layer.

11. The semiconductor device of claim 1, further comprising a high-K dielectric layer disposed between the STI formation and the first metal layer.

12. The semiconductor device of claim 1, wherein the width of the first metal layer in the fuse neck is substantially smaller than the corresponding width of the first metal layer in the anode or the cathode.

13. The semiconductor device of claim 1, wherein the width of the first metal layer in the fuse neck is approximately 20-50 nm.

14. A semiconductor device having an eFuse structure for a one time programmable memory (OTP), comprising:
    a base substrate having a shallow trench isolation (STI) formation;
    an anode, including
        a first portion of a first metal layer;
        a first portion of a second metal layer disposed on, and in contact with, the first portion of the first metal layer;
    a cathode, including
        a second portion of the first metal layer;
        a second portion of the second metal layer disposed on, and in contact with, the second portion of the first metal layer;
    a fuse neck connecting the anode to the cathode, including:
        a third portion of the second metal layer disposed on, and in contact with, a third portion of the first metal layer;
        a fourth portion of the second metal layer disposed on, and in contact with, a fourth portion of the first metal layer; and
        an undoped polysilicon (poly) region disposed on, and in contact with, a fifth portion of the first metal layer, the poly region disposed between and separating the third and the fourth portions of the second metal layer;
    wherein the first, third, fifth, fourth, and second portions of the first metal layer are laterally disposed in a continuous fashion across the STI formation so as to provide a low resistance current path from the anode to the cathode prior to programming.

15. The semiconductor device of claim 14, wherein the thickness of the first metal layer is substantially less than that of the second metal layer.

16. The semiconductor device of claim 15, wherein the resistance of the poly region is substantially higher than that of the first metal layer, so that a current carried by the current path flows primarily through the first metal layer.

17. The semiconductor device of claim 16, wherein the third portion of the first metal layer is configured to fail in response to an increase in current through the third portion, the failure of the third portion causing a high resistance current path between the anode and cathode.

18. A semiconductor device having an eFuse structure for a one time programmable memory (OTP), comprising:
- a base substrate having a shallow trench isolation (STI) formation;
- a first metal layer formed on the STI formation, having a shape that defines an anode, a cathode, and a fuse neck connected between the cathode and the anode;
- an undoped polysilicon (poly) region formed on a first portion but not all of the fuse neck; and
- a second metal layer having a first portion and a second portion that are formed on the first metal layer on opposite sides of the poly region, the first portion of the second metal layer formed on the anode and on a second portion of the fuse neck, and the second portion of the second metal layer formed on the cathode and on a third portion of the fuse neck.

* * * * *